(12) United States Patent
Svasand et al.

(10) Patent No.: US 12,219,745 B2
(45) Date of Patent: Feb. 4, 2025

(54) METHOD FOR MANUFACTURING ANISOTROPIC CONDUCTING BODY

(71) Applicant: CONDALIGN AS, Kjeller (NO)

(72) Inventors: Eldrid Svasand, Valparaiso (CL); Mark Buchanan, Oslo (NO); Matti Knaapila, Drammen (NO); Geir Helgesen, Finstadjordet (NO)

(73) Assignee: CONDALIGN AS, Kjeller (NO)

( * ) Notice: Subject to any disclaimer, the term of this patent is extended or adjusted under 35 U.S.C. 154(b) by 1528 days.

(21) Appl. No.: 16/555,816

(22) Filed: Aug. 29, 2019

(65) Prior Publication Data

US 2020/0245514 A1 Jul. 30, 2020

Related U.S. Application Data

(63) Continuation of application No. 13/380,189, filed as application No. PCT/NO2010/000242 on Jun. 22, 2010, now Pat. No. 10,561,048.

(30) Foreign Application Priority Data

Jun. 22, 2009 (NO) .................................... 20092381

(51) Int. Cl.
*H05K 9/00* (2006.01)
*B05D 1/00* (2006.01)
(Continued)

(52) U.S. Cl.
CPC .......... *H05K 9/0079* (2013.01); *B05D 1/005* (2013.01); *B05D 1/40* (2013.01); *B05D 3/14* (2013.01);
(Continued)

(58) Field of Classification Search
CPC ........ H05K 9/0079; B05D 1/005; B05D 1/40; B05D 3/14; B05D 2601/20; H01M 4/02;
(Continued)

(56) References Cited

U.S. PATENT DOCUMENTS 3,773,684 A 11/1973 Marks
4,024,318 A 5/1977 Forster et al.
(Continued)

FOREIGN PATENT DOCUMENTS

JP 2006202701 A * 8/2006

OTHER PUBLICATIONS

Dascalescu et al, "Modeling of conductive particle behavior in insulating fluids affected by DC electric fields," in IEEE Transactions on Industry Applications, vol. 34, No. 1, pp. 66-74, Jan.-Feb. 1998. (Year: 1998).*

(Continued)

*Primary Examiner* — A. Dexter Tugbang
(74) *Attorney, Agent, or Firm* — Oblon, McClelland, Maier & Neustadt, L.L.P.

(57) ABSTRACT

A layer of the mixture that contains polymer and conductive particles is applied over a first surface, when the mixture has a first viscosity that allows the conductive particles to rearrange within the layer. An electric field is applied over the layer, so that a number of the conductive particles are aligned with the field and thereafter the viscosity of the layer is changed to a second, higher viscosity, in order to mechanically stabilise the layer. This leads to a stable layer with enhanced and anisotropic conductivity.

33 Claims, 7 Drawing Sheets

(51) Int. Cl.
  *B05D 1/40* (2006.01)
  *B05D 3/14* (2006.01)
  *H01B 1/24* (2006.01)
  *H01G 9/00* (2006.01)
  *H01M 4/62* (2006.01)
  *H05F 3/02* (2006.01)
  *H01M 4/02* (2006.01)
  *H01M 4/04* (2006.01)

(52) U.S. Cl.
  CPC .............. *H01B 1/24* (2013.01); *H01G 9/0003* (2013.01); *H01M 4/628* (2013.01); *H05F 3/025* (2013.01); *B05D 2601/20* (2013.01); *H01M 4/02* (2013.01); *H01M 2004/024* (2013.01); *H01M 4/0471* (2013.01)

(58) Field of Classification Search
  CPC ........... H01M 2004/024; H01M 4/628; H01M 4/0471; H01G 4/206; Y02E 60/10
  See application file for complete search history.

(56) References Cited

U.S. PATENT DOCUMENTS

| | | | |
|---|---|---|---|
| 4,170,677 A | 10/1979 | Hutcheson | |
| 4,364,752 A | 12/1982 | Fitch | |
| 4,508,668 A | 4/1985 | Broussoux | |
| 4,548,862 A | 10/1985 | Hartman | |
| 4,657,833 A | 4/1987 | Hadley et al. | |
| 4,707,231 A * | 11/1987 | Berger | H01M 4/02 252/502 |
| 4,740,657 A | 4/1988 | Tsukagoshi | |
| 4,830,903 A | 5/1989 | Levy | |
| 4,873,540 A | 10/1989 | Asanae | |
| 5,769,996 A | 6/1998 | McArdle | |
| 5,777,292 A | 7/1998 | Grigorov | |
| 5,817,374 A | 10/1998 | Detig | |
| 6,180,226 B1 | 1/2001 | McArdle | |
| 6,346,182 B1 | 2/2002 | Bradley | |
| 6,376,393 B1 | 4/2002 | Newton et al. | |
| 6,417,245 B1 | 7/2002 | Fowler et al. | |
| 6,423,172 B1 | 7/2002 | McArdle | |
| 6,552,883 B1 | 4/2003 | Grigorov et al. | |
| 6,563,132 B1 | 5/2003 | Talroze et al. | |
| 6,733,613 B2 | 5/2004 | Khanna | |
| 7,018,917 B2 | 3/2006 | Elers | |
| 7,034,403 B2 | 4/2006 | Divigalpitiya | |
| 7,062,848 B2 | 6/2006 | Pan et al. | |
| 7,097,757 B1 | 8/2006 | Aldissi | |
| 8,052,932 B2 | 11/2011 | Han | |
| 9,437,347 B2 | 9/2016 | Svasand | |
| 2003/0102154 A1 | 6/2003 | Haba | |
| 2004/0224229 A1* | 11/2004 | Mansuetto | H01M 4/02 429/220 |
| 2004/0246650 A1 | 12/2004 | Grigorov | |
| 2006/0246354 A1* | 11/2006 | Lee | H01M 4/0471 429/246 |
| 2008/0128961 A1* | 6/2008 | Slenes | H01G 4/206 264/642 |
| 2008/0176139 A1* | 7/2008 | White | H01M 4/02 429/223 |
| 2009/0038832 A1 | 2/2009 | Chaffins et al. | |
| 2009/0233057 A1 | 9/2009 | Aksay | |
| 2012/0145315 A1 | 6/2012 | Knaapila | |
| 2012/0231178 A1 | 9/2012 | Svasand | |
| 2012/0240992 A1 | 9/2012 | Svasand | |
| 2013/0264019 A1 | 10/2013 | Helgesen | |
| 2013/0276882 A1 | 10/2013 | Buchanan | |

OTHER PUBLICATIONS

International Search Report Issued Oct. 8, 2010 in PCT/NO10/00242 Filed Jun. 22, 2010.
Office Action issued May 22, 2013 in European Application No. 10737388.8.
B. Wunderle, et al., "Failure modeling of ACA-glued flip-chip on flex assemblies", Microsyst Technol, vol. 15, 2009, pp. 3-15.
Wei Lu, et al., "Unsaturated polyester resin/graphite nanosheet conducting composites with a low percolation threshold", Polymer, vol. 47, 2006, pp. 4440-4444.
Matthias-Klaus Schwarz, et al., "Alternating Electric Field Induced Agglomeration of Carbon Black Filled Resins", Polymer, Elsevier Science, ltd., XP004343311, vol. 43, No. 10, May 1, 2002, pp. 3079-3082.
Eldrid Svåsand, et al., "Behavior of Carbon Cone Particle Dispersions in Electric and Magnetic Fields", Colloids and Surfaces A: Physicochemical and Engineering Aspects, XP026076590, vol. 339, No. 1-3, May 1, 2009, pp. 211-216.
International Type Search Report issued Mar. 17, 2010 in Norwegian Patent Application No. 20092381.

* cited by examiner

Fig. 1a  Fig. 1b
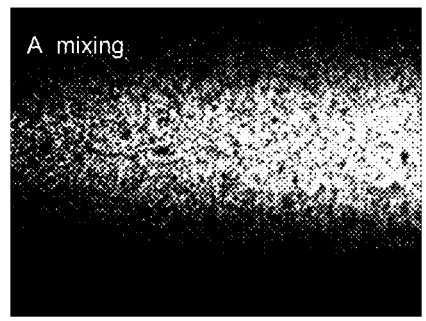
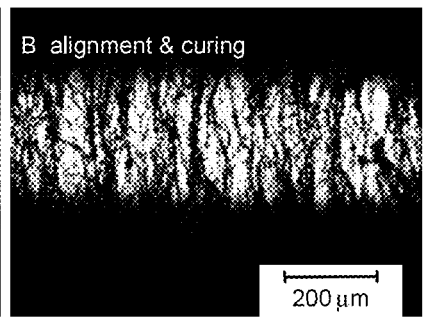
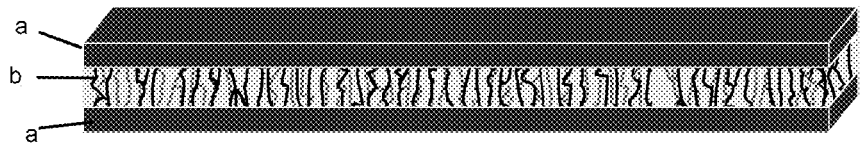
Fig. 1c
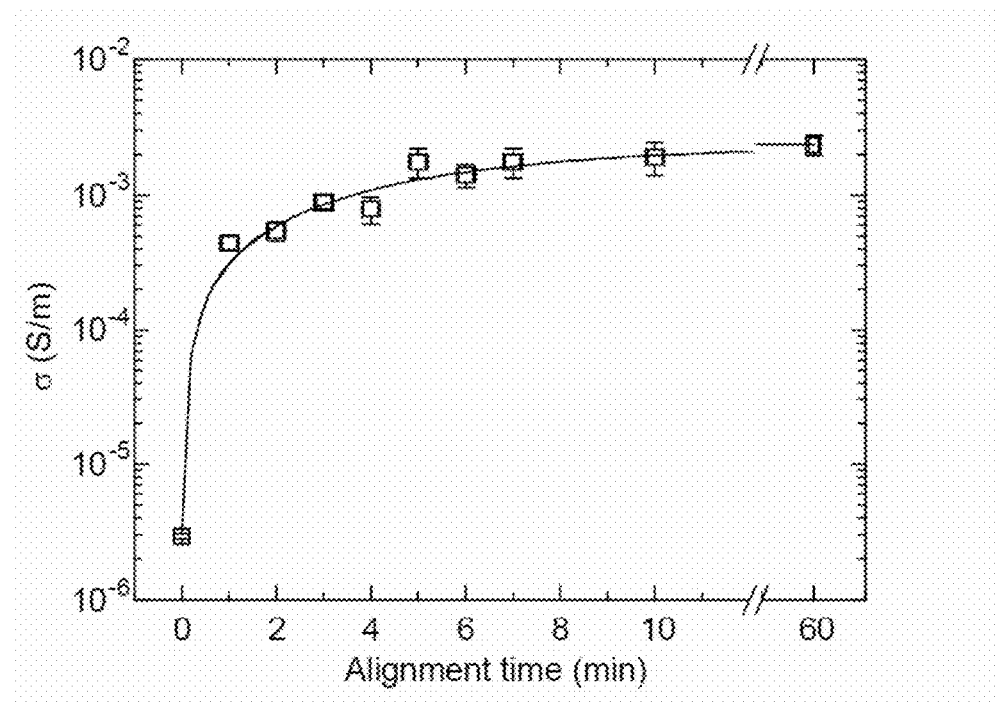
Fig. 2 top view side view

METHOD FOR MANUFACTURING ANISOTROPIC CONDUCTING BODY

TECHNICAL FIELD

The invention concerns a production method for forming an anisotropic conducting polymer body, such as a film or mat, comprising conductive paths of particles in the polymer matrix. The matrix can be an adhesive and be used for joining surfaces and connecting them electrically.

BACKGROUND OF THE INVENTION

Materials of electrically conductive polymer can be based on the mixture of polymer matrix and conductive particles embedded into the matrix or into an inherently conductive polymer.

In the former case the polymer matrix can be an adhesive and the electrically conductive particles metal or metal oxide or carbon particles such as carbon nanotubes (CNTs). The materials can also be directionally conductive. An electrically conductive material will usually also be thermally conductive. Wiedemann-Franz law states that the ratio of the electronic contribution to the thermal conductivity and the electrical conductivity of a metal is proportional to the temperature. For other materials the relationship is more complex.

The electrically conductive polymer films are usually produced by mixing the filler material with a polymer resin and in order to have a conductive mixture the amount of filler material shall exceed the percolation threshold. Mixed systems have limited lifetime and must be re-mixed prior to use.

In order to increase signal transmission capability without having to increase the amount of conductive filler material conductive films are made anisotropic. Anisotropic films can also be designed so that they have insulating properties in certain directions.

In EP 1809716 is described a method for making a directionally conductive adhesive based on CNTs. A tape having an insulation base and a parallel arrangement of CNTs acting as electrical contact points is made by growing carbon CNTs on a material used in the tape or arranging CNTs on the tape before adding the adhesive part to the tape.

In U.S. Pat. No. 5,429,701 is described how electric interconnection between discreet individual conductors of soft magnetic metal in two layers is achieved by adjoining the conductors by a conductive adhesive. The adhesive have particles of soft magnetic metal and by applying a magnetic field the particles can be gathered in an area between the conductors.

It is known that dipolar rigid asymmetric particles or molecules can be aligned by an electric field; this is especially used for small molecular weight liquid crystals.

In these cases material having permanent dipole moments is fluid in normal conditions, which makes electric field alignment possible.

Aligned structures of infusible conductive carbon particles, like CNTs, are known to be formed by chemical vapour deposition or spinning.

A method for the directional growth of CNTs is shown in U.S. Pat. No. 6,837,928. CNTs are grown in an electric field that directs their growth and thus leads to aligned CNTs when the growing procedure is completed.

Electric field alignment of carbon nanocone (CNC) material has been demonstrated in Svåsand et al. Colloids & Surf. A Physicochem. Eng. Aspects 2007 308, 67 and 2009 339 211. In these articles it is shown that nanocone material dispersed in silicon oil can form micron size nanocone "fibres" when a field of minimum 50 V/mm is applied. In order to form fibres within a reasonable time fields of 400V/mm is used.

In Schwarz et al. Polymer 2002, 43, 3079 "Alternating electric field induced agglomeration of carbon black filled resins" is reported how carbon black filled resins below zero-field percolation threshold can form electrically conductive networks when a field of 400 V/cm is applied between copper electrodes dipped into the resin. This result has been reproduced by Prasse et al. Compos. Sci. Tech. 2003, 63, 1835.

US 20090038832 describes a method for forming an electrical path having a desired resistance from a mixture of carbon and metallic nanotubes dispersed in a curable polymer matrix. Electrodes are placed in contact with the dispersion and electrical energy is applied until the desired electrical resistance is reached. A pure semi-conducting connection can be achieved by burning away metallic nanotubes that may be part of the carbon nanotube mixture, by applying a current after the deposition. The polymer matrix is cured in order to fix the device. Essentially same result has been achieved using copper particles in US20030102154A1.

A disadvantage with the method is that carbon nanotubes are very expensive and difficult to produce on an industrial scale. A dispersion of nanotubes is difficult to store and require specific manufacturing steps like homogination or sonication prior to application of the dispersion to the substrate and electrode.

These methods are dedicated to the use of microelectronics and circuit boards. Moreover, they aim at connecting the alignment electrodes so that the alignment is a step-wise procedure where the alignment electrodes are connected to the material and remain in the end product.

DESCRIPTION OF THE INVENTION

The invention provides for a method for forming an anisotropic conductive body, such as a film, or mat, comprising a matrix mixed with conductive particles and subsequent stabilization of the matrix. Both thermal conductivity and electrical conductivity is described herein by the terms conductive and conductivity.

The term film includes free-standing film, below 1 cm, made of one or more layers, comprising one or more conducting layer of the present invention. The term film also includes a thin layer attached to at least one substrate, used to make e.g. the surface of a body conductive, or to make a conductive layer within a laminate. If the film is made from an adhesive polymer, the present invention can be used as conductive glue. Films can also be used for making electrostatic discharge (ESD) devices.

The term mat includes structures above 1 cm of thickness made of one or more layers, comprising one or more conducting layer of the present invention. The term mat also includes a layer attached to at least one substrate, used to make e.g. the surface of a body conductive, or to make a conductive layer within a laminate. If the mat is made from an adhesive polymer, the present invention can be used as conductive glue.

The conductive particles are infusible conductive particles such as carbon particles, metal or metal oxide particles. The conductive particles show low molecular or particle anisotropy and thus the major part of the conductive particles has low aspect ratio; aspect ratio ranges of 1-4, or 1-5, 1-10 or 1-20 are typical. The terms "low molecular or particle anisotropy" and "low aspect ratio" has the same meaning herein. This is the case with spherical carbon black (CB) or disk-like or conical carbon particles here referred to as carbon nanocones (CNC). The conductive particles can be a mixture of different carbon particles. Also other conductive particles can be used, like metal, such as silver or metal oxide particles or colloidal metal particles.

The matrix can be a polymer system of any kind and it can contain one or several components. In particular, it can be a thermoset polymer system which means that the matrix is originally fluid but can be solidified by cross-links. This polymer can be an adhesive. It can also be a thermoplastic polymer system which means that the polymer is solid or viscous at lower temperatures but can be reversibly melted or plasticised by rising the temperature. It can moreover be a lyotropic polymer system which means that the polymer matrix can be plasticised by solvent and solidified by evaporating this solvent off. It can also be any combination of these systems. For example, the thermoset polymer system can contain solvent for plasticizing it but the stabilization can be based primarily on cross-linking and only secondarily on the solvent evaporation.

The adhesive can be ultraviolet light (UV) curing adhesives, also known as light curing materials (LCM). UV curing adhesives have rapid curing time and strong bond strength. They can cure in as short tims as a second and many formulations can bond dissimilar materials and withstand harsh temperatures. These qualities make UV curing adhesives essential to the manufacturing of items in many industrial markets such as electronics, telecommunications, medical, aerospace, glass, and optical. Unlike traditional adhesives, UV light curing adhesives not only bond materials together but they can also be used to seal and coat products.

When exposed to the correct energy and irradiance in the required band of UV light, polymerization occurs, and so the adhesives harden or cure. The types of UV sources for UV curing include UV lamps, UV LEDs and Excimer Flash lamps.

Laminates can be built up with successively applied UV cured layers. This obviates the need for adhesive or primer layers. Thin layers can be formed in very short time, in the range of one second. There are a wide variety of UV curable vinyl monomers, particularly acrylics, with a wide variety of properties that can be combined by means of copolymers or laminates. For example strong acrylics can be combined with the fracture resistant acrylates. Acrylics could be combined with intermediate layers of cross-linked elastomers for maximizing tear strength while retaining surface hardness. Certain fluoracrylates are hard, and antireflective. They have higher specular transmission than a commonly used fluoropolymer, because fluoroacrylates can be completely amorphous and have no scattering centers. Epoxy resins have tightly linked adhesive polymer structures and can be used in surface adhesives and coatings. Such epoxy resins forms cross-linked polymer structures that have strong adhesion and low shrinkage.

There are many systems available for UV curing an adhesive, coating or film. The Dymax Heavy-Duty UV curing Widecure™ Conveyor Systems is an example of a system mounted on a conveyor belt. Dymax BlueWave LED Prime UVA used LED light and thus use less effect and have constant high intensity.

An element of the invention is that conductive paths can be formed of predominantly low aspect ratio particles like CB or CNC particles and the formation can take place at low electric field strengths. This simplifies the production equipment and enables both larger surfaces and thicker films to be produced. The CB and CNC particles are considerably cheaper than the carbon nanotubes and can be produced in sufficient quantities by industrial methods. Moreover, it is more difficult to form uniform dispersions with carbon nanotubes than CB and CNC.

Another element of the invention is that formation of conductive paths can take place at low electric field strengths. This simplifies the electric equipment and the handling of films and substrates. This means that no specific safety aspects related to the high voltages are required.

The electric field can be in the order of 0.01-20 kV/cm or 0.1-5 kV/cm, or 0.1 to 1 kV/cm. This means that for alignment distance in the range of 10 micrometer to 1 mm the voltage applied can be in the range of 10-2000 V. The field is an alternating (AC) field. A typical field is an AC field has a frequency of 10 Hz to 10 kHz. High frequencies >1 kHz are required for the smaller particle size <1 micrometer. Direct (DC) electric field or very low frequencies <10 Hz lead to asymmetric chain formation and build up, which can nevertheless conduct current.

The direction of the electric field can be predetermined by the electrode arrangement and thereby the direction of the electric connections formed by the aligned conductive particles can be controlled.

It is also possible to heal aligned conductive particle pathways; if the conductive pathways have become defect or not properly aligned in the first step, the alignment step can be rerun for the case that the stabilization step of the matrix is not yet performed or if the stabilization step is reversible. This has the advantage that for existing films under preparation of the connections the process need not to be started afresh.

The manufacturing of anisotropic conductive films does not require that the film forming polymer-particle mixture is in contact with the electrodes. The manufacturing process can be conducted in a continuous way or step-wise. The anisotropic film can be attached to a substrate or be a free-standing film; or it can be attached to one electrode, thus forming a semi-free-standing film. The electric field can be created between electrodes that can be placed either in direct contact with one or both sides of the polymer film layer or outside additional insulating layers, where the insulating layers are placed either in direct contact with the film layer or not.

Another element of the invention is that the concentration of conductive particles may be low. For conductive mixtures a percolation threshold is defined as the lowest concentration of conductive particles necessary to achieve long-range conductivity in the random system. In a system formed by a method according to the invention the concentration of conductive particles necessary for achieving conductivity in a predefined direction is not determined by the percolation threshold and the concentration can be lower. For practical reasons the concentration of particles is determined by the requirements on the conductive paths, there usually being no reason to have excess amounts of conductive particles not arranged into the conductive paths. The concentration of conductive particles in the polymer matrix could be up to 10 times lower than the percolation threshold or even lower. Concentrations of conductive particles may be in the range of 0.2-10 vol %, or 0.2-2 vol %, or 0.2-1.5 vol %.

This has several advantages in that mixtures having only small amounts of conductive particles are less prone to macrophase separation and are thereby easier to store. Also the mechanical strength of the anisotropic conductive film is increased if the amount of particles can be reduced. For UV cured films the curing process is more effective when the amount of particles which may shield the UV light is lower. Likewise the transparency of a film can be increased if the amount of particles can be reduced. A lower amount of conductive particles is also a cost-saving element.

In an embodiment additional steps to remove most or the entire matrix after alignment to yield distinctive, aligned molecular wires of the conductive particles are made. The removal can be done for example by excess heating (e.g. pyrolysis) or by chemical treatment (e.g. selective solvent).

In another embodiment the formation of conductive paths is performed directly on an electrode in order to increase the surface structure of the electrode.

The use of the present invention includes: electrostatic discharge (ESD) devices, conductive glue and adhesives for use in solar panels and electronics. Advantages include a low fraction of conducting material in the matrix, as conductivity is achieved below the percolation threshold and this gives mechanical and optical properties closer to that of the used polymer without the conductive particles. Also the process of applying an electrical field and using UV curing is easy to add to an existing manufacturing process, so that using the present invention as a conductive adhesive can be done an amendment to an existing production line.

LIST OF DRAWINGS

FIG. 1 show optical micrographs of assemblies of 0.2 vol-% CNC particles dispersed into the adhesive (FIG. 1A) and aligned by the electric field (FIG. 1B) as well as the schematic of the situation (FIG. 1C)

FIG. 2 plots the dependence of DC conductivity of 0.2 vol-% CNC particles dispersed into the adhesive against the alignment time. The solid line is guide to the eye.

DETAILED DESCRIPTION OF THE INVENTION

Figure 3A:
FIG. 3 shows aligned film with (FIG. 3A-FIG. 3B) and without (FIG. 3C-FIG. 3D) electrical contacts between electrodes
Figure 3B:
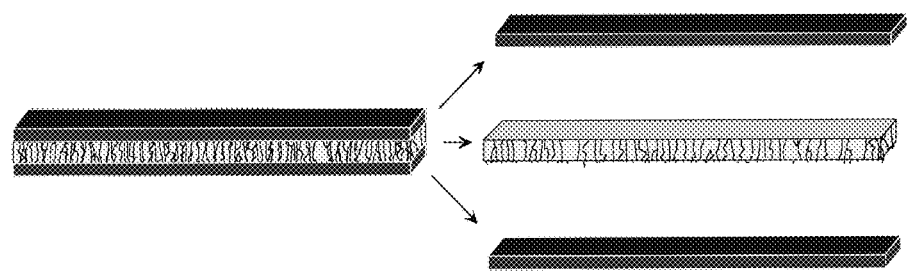
Figure 3C:
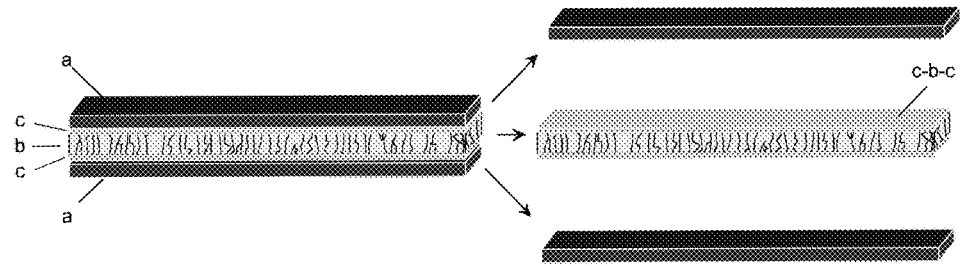
Figure 3D:
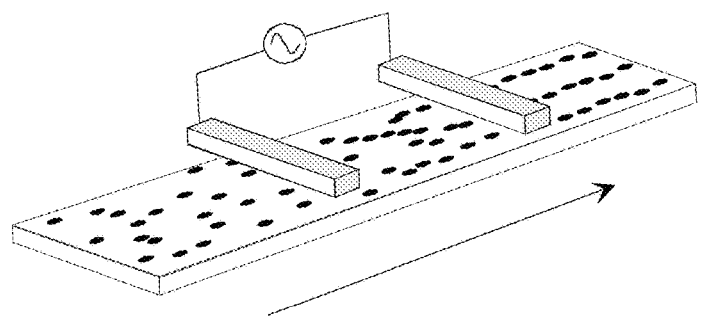

The present invention will be described below with reference to examples and figures. It is to be understood that the present invention is by no means limited to these examples and figures.

The method can be used in a production line for ESD (electrostatic dissipation or discharge, also known as antistatic) devices, such as films for antistatic packaging or antistatic mats or boards. A thermally conductive film can also be made, that can e.g. be used for lighting reflectors or electronic parts, or a thermally conductive mat that e.g. can be used for form a heat sink. The method comprises the following steps:

i. a matrix is formed from epoxy mixed with conducting particles, according to the present invention
ii. the matrix is applied to a substrate e.g. by spraying, pouring or dipping
iii. an electrical field in the range of 0.01 to 20 kV/cm is applied
iv. the matrix is cured, using e.g. UV light or heat
v. optionally the matrix is reduced, so as to expose the conducting pathways
vi. optionally steps ii to v is repeated to create several layers, e.g. for creating conductive pathways in different directions.

The method can also be used in a production line for e.g. solar cells or electronics. The method comprises the following steps:

i. epoxy is mixed with conducting particles to form a matrix with conducting particles
ii. the matrix is applied between surfaces that shall be electrically and mechanically connected
iii. an electrical field in the range of 0.01 to 20 kV/cm is applied over the matrix
iv. the matrix is cured, using e.g. UV light or heat

Example 1

This example concerns the preparation of a mixture of conductive particles and polymer matrix that in this example is an thermally cured polymer adhesive; as well as determination of conductivity as a function of particle load; and how the step-like increase in conductivity with increasing particle load can be explained by formation of conductive paths between particles when the contacts are formed with increased particle fraction.

This example concerns moreover the preparation of the same mixture when the particle load is low, for example 10 times less than the observed percolation threshold, the limit where the isotropic non-aligned mixture is not conductive; as well as the alignment of this mixture using electric field so that the aligned particles form conductive paths resulting in a conductive material, whose conductivity is directional. The example, moreover, shows change of the viscosity of so obtained material, by curing, so that the alignment and directional conductivity obtained in the alignment step is maintained.

The employed conductive particles were CB from Alfa Aesar, CNC from n-Tec AS (Norway) and iron oxide ($FeO \cdot Fe_2O_3$) from Sigma-Aldrich.

The employed polymer matrix was a two component low viscosity adhesive formed by combining Araldite® AY 105-1 (Huntsman Advanced Materials GmbH) with low viscosity epoxy resin with Ren® HY 5160 (Vantico AG).

The conductive particles were mixed in the adhesive by stirring for 30 minutes. Due to the high viscosity of mixture, efficient mixing is possible only up to 20 vol-%. of particles.

Estimated percolation threshold of these materials are at ~2 vol-%. The mixtures are conductive above and insulators below this threshold. The conductivity is due to the conductive particles and the polymer is essentially insulator.

To illustrate the benefit of alignment, the particle loads of 1/10 of the estimated percolation threshold were used.

FIG. 1 illustrates, using optical micrographs, the mixing of assemblies of 0.2 vol-% CNC particles dispersed into the example adhesive before (FIG. 1A) and after an electric field alignment and curing (FIG. 1B).

The scheme shows the applied alignment (out-of-plane) geometry (FIG. 1C). This alignment geometry was used to cover conductive path distances from 10 μm to 2 mm. For an out-of-plane alignment 2 mm×3 cm wide layer of material is injected between two metal electrodes with spacing of ≤2 mm.

Mixture was aligned using an AC source. In this example the alignment procedure 1 kHz AC-field (0.6-4 kV/cm, rms value) was employed for >10 minutes for >1 mm electrode spacing and <10 minutes for <1 mm electrode spacing.

FIG. 2 shows the conductivity as a function of alignment time illustrating orders of magnitudes conductivity enhancement.

The curing was performed immediately afterwards at 100° C. for 6 minutes.

The material remains aligned after curing and conductivity level obtained by alignment is maintained.

Example 2

This example concerns versatile choice of alignment conditions and illustrates how the present invention can be employed not only with electrodes connected to the orientation material but also with electrodes electrically isolated from the material.

The procedure was otherwise similar to that in example 1, but instead of having material directly connected to the alignment electrodes, the electrodes were electrically disconnected from the material by an insulating layer, for example by 0.127 mm Kapton® foils. Alignment occurred exactly as in Example 1.

This procedure allows removal of electrodes after alignment and thus freestanding aligned film even in the case where the matrix is adhesive. The alignment also occurs if the electrodes do not touch the material and so the alignment can be performed from the distance. When the material and electrodes are moved, continuous or stepwise, with respect to each others during the alignment, this allows continuous alignment processing. Three possible options for the alignment settings are illustrated in FIG. 3 that shows aligned film with (A-B) and without (C-D) electrical contacts between electrodes (a) and material (b). In the case (A) the aligned film forms permanent connection between the electrodes. In the case (B) the electrodes and material are only loosely joined together and can be moved apart after alignment. In the case (C) there are insulating layers (c) between the material and electrodes and they are easily moved apart after the alignment even in the case where the material is an adhesive. In this case the obtained material is a multilayer consisting of aligned layer (b) and two insulating layers (c) In the case (D) the alignment is carried out from the distance and the mutual location of electrodes and film can be additionally moved during the alignment.

Example 3

This example concerns the applicability of the alignment method, the use of alignment for particular application of UV-curing. This emphasises the benefit of low particle fraction which makes the material more transparent for UV light for curing.

The procedure was otherwise similar to that in example 1 or 2 but the thermally cured polymer matrix was replaced by UV-curable Dymax Ultra Light-Weld® 3094 adhesive and the curing step was done by the UV-light with the wavelength 300-500 nm.

Figure 4:
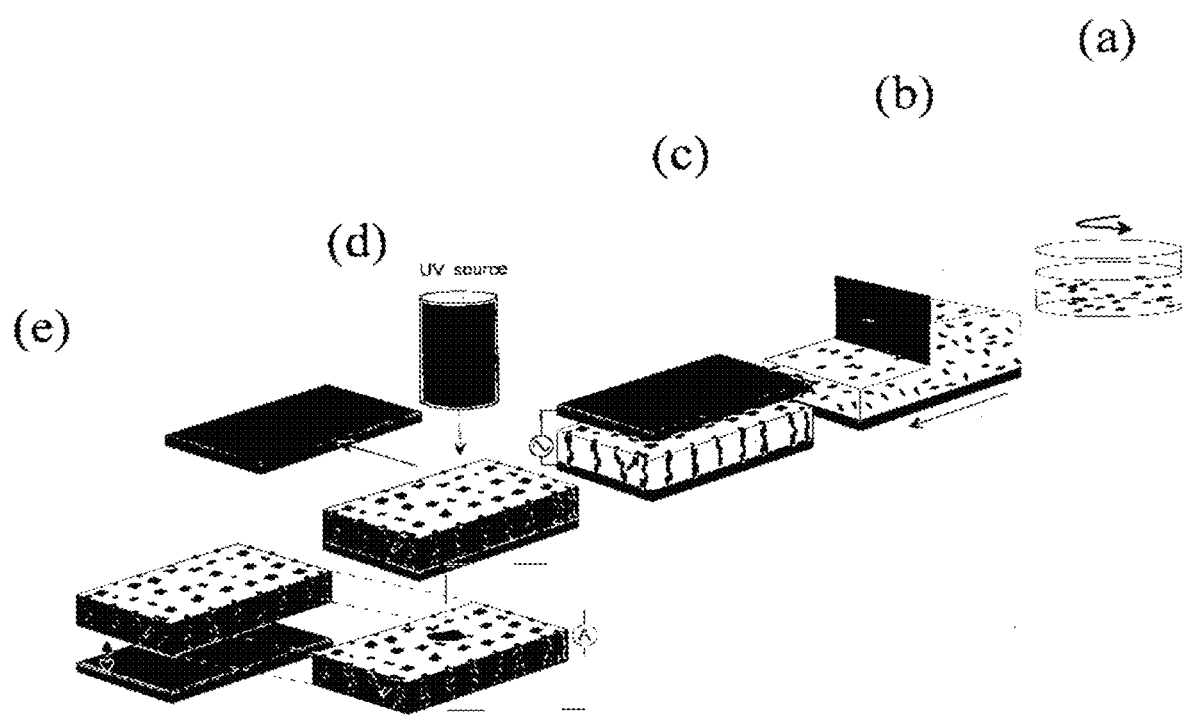
FIG. 4 shows schematics of the UV curing technique.
Figure 5A:
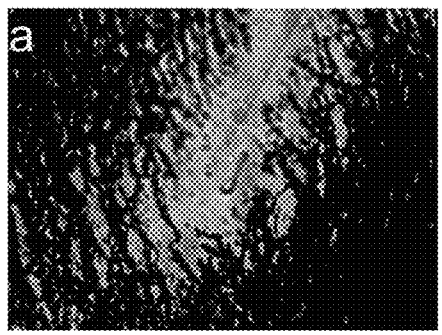
FIG. 5A to FIG. 5F shows optical micrographs showing the healing of a scratch.
Figure 5B:
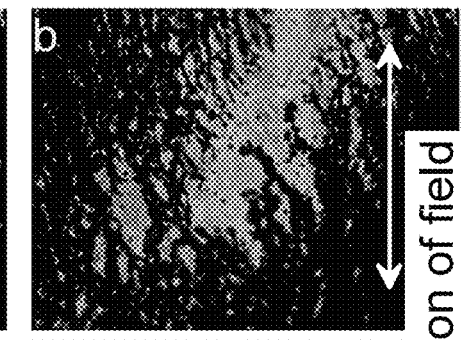
Figure 5C:
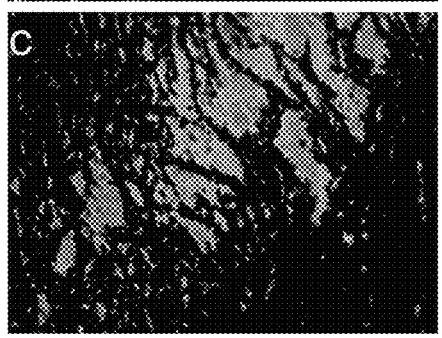
Figure 5D:
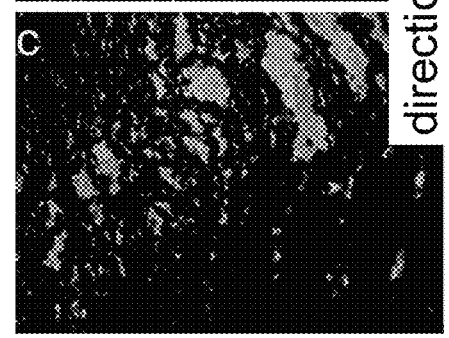
Figure 5E:
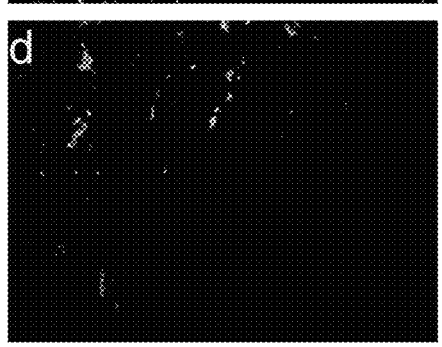
Figure 5F:
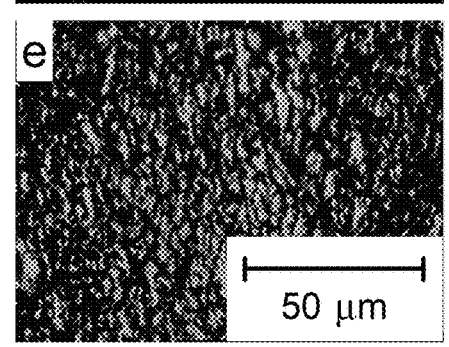

FIG. 4 illustrates the alignment of 0.2 vol-% CNC dispersion in out-of-plane geometry. The mixture was formed following the guideline of example 1 (FIG. 4a) but spread on the alignment electrode using RK Print Paint Applicator that uses a moving bird applicator to level the adhesive layer to the predetermined thickness (the idea is schematically illustrated in FIG. 4b). This admixture was aligned following the method outlined in example 2 but the upper electrode was not in contact with the material by use of an insulating layer such as Kapton (FIG. 4c); this allows removal of electrodes after alignment and thus freestanding aligned film even in the case where the matrix is adhesive. After alignment, the upper alignment electrode is removed and aligned admixture cured by UV or blue light. (FIG. 4d). The lower electrode can be optionally removed (FIG. 4e) to form a fully freestanding film.

FIG. 4 also gives the schematics of UV curing. Conductive particles are dispersed with UV-curable polymer matrix (a). This mixture is spread to form a predetermined layer on the substrate (that acts also as an alignment electrode) using an applicator (b). The material is aligned by electric field using lower electrode and another top-electrode that does not touch the material (c). The upper electrode is removed and the aligned mixture is cured using a light (UV/vis) source, which leads to a semi-freestanding aligned film (d). If required, the lower electrode can be additionally removed leading to a fully free-standing aligned film (e).

Example 4

This example shows how the present invention can be employed with thermoplastic or thermotropic polymer matrix.

The procedure was otherwise similar to that in Example 1 or 2 but thermoplastic or thermotropic polymer is used instead of thermoset polymer. In this example alignment was performed when the material was fluid at elevated temperature above the melting point of material. Permanent alignment was achieved when the temperature of fluid matrix with aligned particles was decreased below its glass transition or melting point, which resulted in the stabilization of material.

The used matrix material was polyfluorene polymer (American Dye Source, with melting point at 180° C.)

Example 5

This example illustrates how the invention can be employed with polymer matrix and co-solvent.

The procedure was otherwise similar to that in examples 1, 2, 3, or 4 but the polymer matrix contains solvent. The alignment was performed with the presence of solvent and the solvent was evaporating off after alignment. This can occur with or without curing of thermoset polymer or cooling thermoplastic or thermotropic polymer.

In the case of thermoset polymer matrix this solvent decreases the viscosity of matrix polymer. This means that the solvent acts as thinner. An example solvent in the thermocured polymer in example 1 is benzylalcohol that is a good solvent for epoxy resin and hardener.

In the case of thermoplastic or thermotropic polymer matrix in example 1 this solvent makes the mixture fluid already below the melting point of matrix and allows thus alignment at lower temperature. A possible solvent in example 4 is toluene that is a good solvent for polyfluorene.

Example 6

This example shows the robustness of the procedure and shows how electric field heals macroscopic defects in a conductive particle adhesive mixture.

The materials and procedure was similar to that in examples 1, 2, 3, 4, or 5, but a macroscopic scratch defect was made by a sharp spike; and the electric field was reapplied. FIG. 5 *a-f* are optical micrographs showing the healing of the scratch in the case of CNC particle mixture.

Example 7

This example concerns versatile choice of alignment geometries and illustrates how the invention can be employed not only in the geometry shown in Example 1 but also in (i) thin films and (ii) in in-plane geometry. This example underlines the generality of the method.

The material was the same and the procedure similar as in Example 1, but instead of out-of-plane alignment geometry, in-plane alignment geometry was used.

For the in-plane alignment ~10 μm thick layer was spread either by spin-coating or by plastic spatula over 1 cm×1 cm area of metal finger grid where the thickness and width of fingers, respectively, were 50-200 nm and 2-10 μm. The spacing between fingers was 10-100 μm.

Figure 6A:
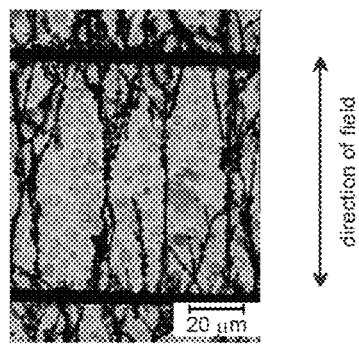
FIG. 6A to FIG. 6C shows aligned and cured conductive particle polymer system in in-plane geometry.
Figure 6B:
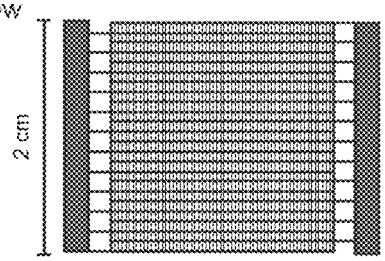
Figure 6C:
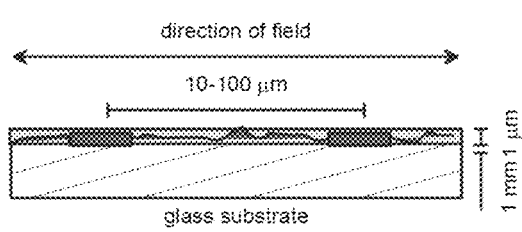

FIG. 6 illustrates aligned and cured conductive CNC adhesives in in-plane geometry. FIG. 6*a* shows an optical micrograph 0.2 vol-% aligned material. Schematic (FIG. 6*b*) illustrates the alignment setting. In this geometry the alignment occurs typically in seconds or tens of seconds.

In another version the alignment electrodes were electrically insulated for example by $SiO_2$ layer following the idea of example 2. Alignment was achieved exactly as without insulating layer.

Example 8

This example concerns versatile choice of alignment geometries and illustrates how the invention can be employed not only in the out-of-plane and in-plane geometries with flat well defined electrodes but also when the geometry and electrode shape is arbitrary. This example underlines the generality of the method. This also illustrates that the alignment does not require a surface or interface parallel to the emerging aligned pathways.

Figure 7:
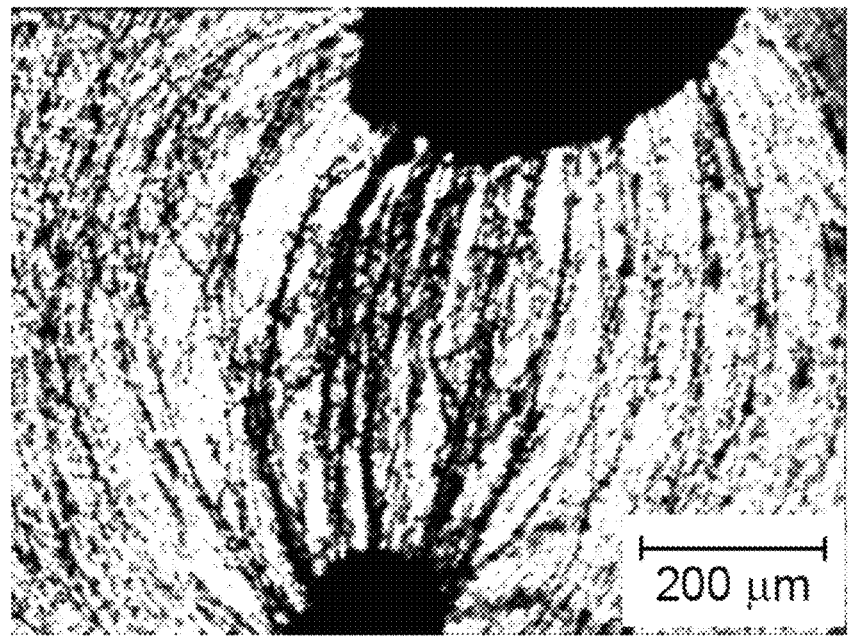
FIG. 7 shows aligned material with arbitrary alignment geometry and arbitrary electrode shape.

The materials were otherwise the same and the procedure similar as in Example 1, 2, 3, 4, or 5 but instead of out-of-plane or in-plane alignment geometry and flat electrodes, arbitrary geometry and arbitrary electrode shape were used. FIG. 7 shows an optical micrograph of aligned material when arbitrary geometry and arbitrary electrode shapes have been used.

Example 9

This example concerns another feature of the invention, the reduction of matrix after alignment and stabilization. This illustrates how the present invention can be employed in (i) thin films and (ii) in in-plane geometry so that the outcome forms solitary network of aligned pure conductive particles or aligned channels with conductive core and insulating mantle.

Figure 8:
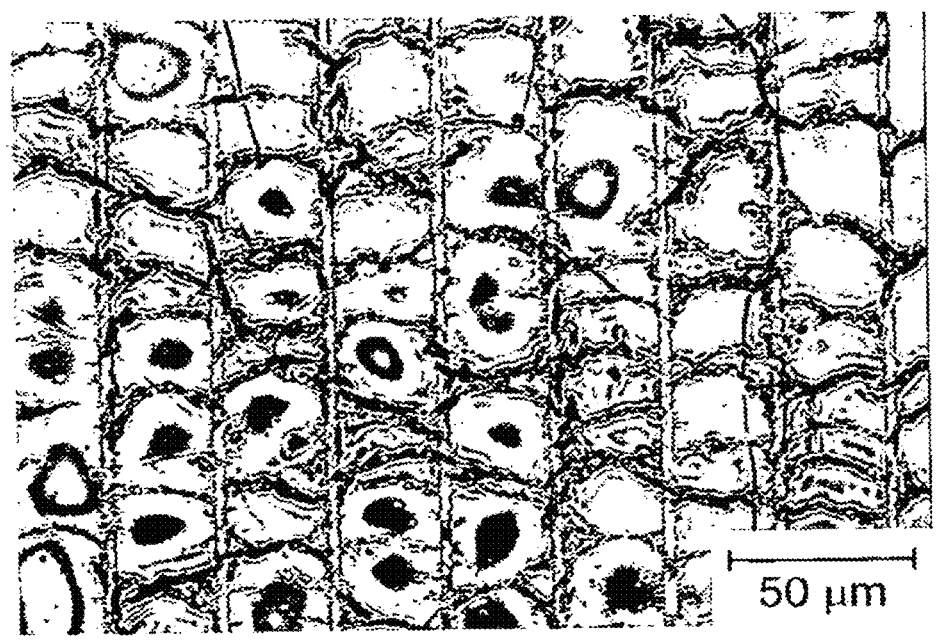
FIG. 8 shows an optical micrograph of aligned and cured film of nanocone adhesives in in-plane geometry after pyrolysis.

The material was otherwise the same and the procedure similar as in example 1 but all or part of the matrix was removed from the aligned and cured film. In typical procedure the aligned and cured film was heated at 450° C. from 10 minutes to 2 hours. As a result of this procedure step, the thickness of matrix was greatly reduced between the conductive channels and instead of a uniform film with aligned conductive channels embedded into it, a film with distinctive solitary network was achieved (see FIG. 8).

Figure 9:
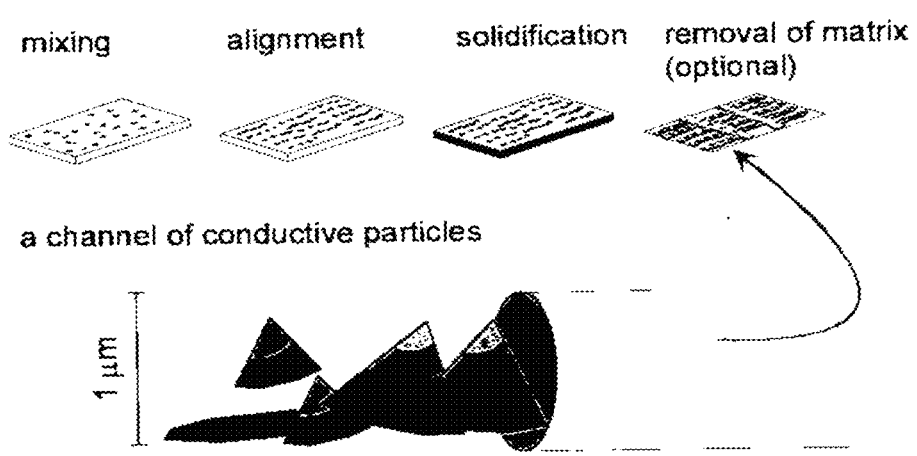
FIG. 9 illustrates the steps to produce aligned conducting.

This procedure can be performed similarly to the materials examples shown in examples 1, 2, 3, 4, or 5. Alternative overall steps are illustrated in FIG. 9, which illustrates the steps to produce aligned conducting film. From left to right: Molecules are dispersed into fluid which can be thermoset, thermoplastic or lyotropic material. Thin film of this dispersion is spread over a substrate. Aligned particle channels forming conductive channels are formed by applying an electric field. Solid uniform film with aligned conductive channels is formed by changing the viscosity. In the case of thermoset matrix this is achieved by curing the matrix polymer. In the case of thermoplastic matrix this is achieved by decreasing the alignment temperature below a phase transition such as melting point or glass transition of the matrix. In the lyotropic case the alignment is performed with the presence of solvent and the solidification obtained by evaporating solvent off. A network of separated aligned wires may be formed by removing part or the entire matrix, for instance by a selective solvent or by pyrolysing a part of the solid matrix.

Example 10

This example concerns further versatility of the invention, the use of electric field alignment when preparing electrodes with very large contact area dendrimer surface.

Figure 10:
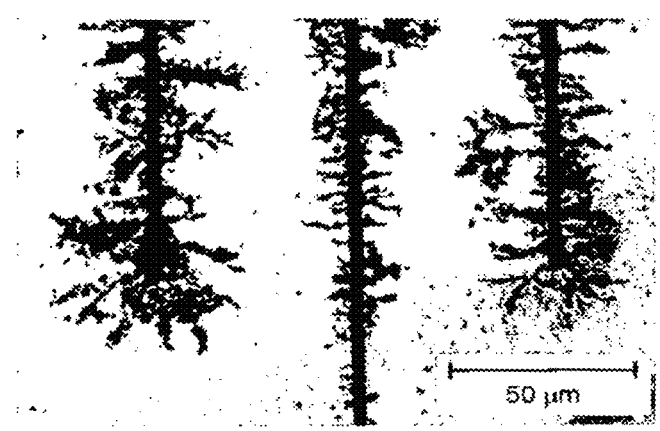
FIG. 10 illustrates dendritic structures maximizing the contact area between conductive item and matrix.

The procedure was otherwise similar to that in examples 1, 2, 3, 4, 5, 7, 8, or 9 but the alignment was terminated before the chains reached from electrode to electrode. FIG. 10 shows so obtained electrodes with dendritic surface.

The invention claimed is:

1. A method for forming a body comprising a mixture of a matrix and conductive particles having a low aspect ratio, the method comprising:
    providing the mixture comprising the matrix capable of being stabilized and the conductive particles;
    aligning the conductive particles into conductive pathways by applying an electric field between alignment electrodes, wherein the electric field is an alternating current field;
    stabilizing the mixture; and
    second aligning the conductive particles into the conductive pathways by applying the electric field between the alignment electrodes to repair defective conductive pathways,
    wherein the electric field applied is in an order of 0.1-20 kV/cm, and
    wherein the conductive particles are at least one infusible conductive particle, a metallic particle, a metal oxide particle, and a colloidal metal particle.

2. The method in accordance with claim 1, wherein one or more of the alignment electrodes are not in direct contact with the mixture during the aligning.

3. The method in accordance with claim 2, wherein one or more of the alignment electrodes are insulated from the mixture.

4. The method in accordance with claim 1, wherein the alignment electrodes are in-plane, out-of-plane or arbitrary oriented in relation to the body.

5. The method in accordance with claim 1, wherein the matrix is a UV curable polymer.

6. The method in accordance with claim 1, wherein the matrix is an adhesive.

7. The method in accordance with claim 1, wherein a concentration of the conductive particles in the mixture is below a percolation threshold.

8. The method in accordance with claim 1, wherein one or more of the alignment electrodes are in contact with the mixture, and the aligning is interrupted before the conductive pathway has reached through the mixture.

9. The method in accordance with claim 1, wherein said conductive particles have an aspect ratio ranging from 1-4.

10. The method in accordance with claim 1, wherein said conductive particles have an aspect ratio ranging from 1-5.

11. The method in accordance with claim 1, wherein said conductive particles have an aspect ratio ranging from 1-10.

12. The method in accordance with claim 1, wherein said conductive particles have an aspect ratio ranging from 1-20.

13. The method in accordance with claim 1, wherein said electric field applied is in the order of 0.1-5 kV/cm.

14. The method in accordance with claim 13, wherein said electric field applied is in the order of 0.1-1 kV/cm.

15. The method in accordance with claim 1, wherein said electric field is an alternating field having a frequency of 1-Hz to 10 kHz.

16. The method in accordance with claim 1, wherein conductive particle is an infusible conductive particle.

17. The method in accordance with claim 1, wherein the infusible conductive particle is a carbon particle selected from the group consisting of spherical carbon black, carbon cones, carbon discs, and a mixture thereof.

18. The method in accordance with claim 1, wherein the conductive particles comprise a member selected from the group consisting of a metallic particle, a metal oxide particle, and a colloidal metal particle.

19. A method for forming a body comprising a mixture of a matrix and conductive particles, the method comprising:
   providing the mixture comprising the matrix capable of being stabilized and the conductive particles;
   aligning the conductive particles into conductive pathways by applying an electric field between alignment electrodes, wherein the electric field is an alternating current field;
   stabilizing the mixture; and
   second aligning the conductive particles into the conductive pathways by applying the electric field between the alignment electrodes to repair defective conductive pathways,
   wherein the electric field applied is in an order of 0.1-20 kV/cm, and
   wherein the conductive particles have an aspect ratio ranging from 1-20.

20. The method in accordance with claim 19, wherein one or more of the alignment electrodes are not in direct contact with the mixture during the aligning.

21. The method in accordance with claim 18, wherein one or more of the alignment electrodes are insulated from the mixture.

22. The method in accordance with claim 19, wherein the alignment electrodes are in-plane, out-of-plane or arbitrary oriented in relation to the body.

23. The method in accordance with claim 19, wherein the matrix is a UV curable polymer.

24. The method in accordance with claim 19, wherein the matrix is an adhesive.

25. The method in accordance with claim 19, wherein a concentration of the conductive particles in the mixture is below a percolation threshold.

26. The method in accordance with claim 19, wherein one or more of the alignment electrodes are in contact with the mixture, and the aligning is interrupted before the conductive pathway has reached through the mixture.

27. The method in accordance with claim 19, wherein said conductive particles have an aspect ratio ranging from 1-4.

28. The method in accordance with claim 19, wherein said conductive particles have an aspect ratio ranging from 1-5.

29. The method in accordance with claim 19, wherein said conductive particles have an aspect ratio ranging from 1-10.

30. The method in accordance with claim 19, wherein said electric field applied is in the order of 0.1-5 kV/cm.

31. The method in accordance with claim 19, wherein said electric field applied is in the order of 0.1-1 kV/cm.

32. The method in accordance with claim 19, wherein said electric field is an alternating field having a frequency of 1-Hz to 10 kHz.

33. The method according to claim 19, wherein the conductive particles are infusible conductive particles.

* * * * *